United States Patent [19]
Klein et al.

[11] Patent Number: 6,046,088
[45] Date of Patent: Apr. 4, 2000

[54] METHOD FOR SELF-ALIGNING POLYSILICON GATES WITH FIELD ISOLATION AND THE RESULTANT STRUCTURE

[75] Inventors: Richard K. Klein, Mountain View; Asim A. Selcuk, Cupertino; Nicholas J. Kepler, San Jose; Craig S. Sander, Mountain View; Christopher A. Spence; Raymond T. Lee, both of Sunnyvale; John C. Holst, San Jose, all of Calif.; Stephen C. Horne, Austin, Tex.

[73] Assignee: Advanced Micro Devices, Inc., Sunnyvale, Calif.

[21] Appl. No.: 08/985,400

[22] Filed: Dec. 5, 1997

[51] Int. Cl.⁷ .................................................. H01L 21/336
[52] U.S. Cl. ...................... 438/296; 438/294; 438/296; 438/424; 438/437
[58] Field of Search ................................. 438/424, 294, 438/435, 437, 296; 148/DIG. 50

[56] References Cited

U.S. PATENT DOCUMENTS 5,242,853  9/1993  Sati et al. ................... 148/DIG. 50
5,926,722  7/1999  Jang et al. ................... 438/424

*Primary Examiner*—Trung Dang
*Attorney, Agent, or Firm*—Foley & Lardner

[57] ABSTRACT

A method of forming field isolation in a semiconductor substrate, such as shallow oxide trenches, for isolation of FET transistors, including complementary FETs such as CMOS, with selected sections of said trenches extending above the substrate and being coplanar with the upper surface of subsequently formed polysilicon gates. An etch protective layer is used during the formation and the filling of the trench openings so that the top of the trenches are coplanar with upper surface of the etch protective layer. Selected sections of the trenches are masked and protected prior to planarization of the non-masked trenches to the bottom edge of the etch protective layer. After deposition and planarization of the poly, the upper surface of a deposited polysilicon layer for forming polysilicon gates of FET transistors is coplanar and self-aligned with the upwardly extending selected sections of the field isolation trenches.

10 Claims, 4 Drawing Sheets

METHOD FOR SELF-ALIGNING POLYSILICON GATES WITH FIELD ISOLATION AND THE RESULTANT STRUCTURE

FIELD OF THE INVENTION

This invention relates to fabricating an integrated circuit with field isolation of semiconductor devices and the resulting structure of the integrated circuit.

BACKGROUND OF THE INVENTION

With increasing levels of integration in semiconductor chips or dies, such as those with a silicon substrate, several conflicting demands are put on the integrated circuit process. Today's circuits demand high performance and high density, but also require low leakage currents to minimize power consumption. As the layout of the integrated circuit positions the transistors closer and closer together, it becomes increasing difficult to isolate the transistors so that parasitic leakage currents do not result.

Isolation of the transistors is generally accomplished by separating the individual transistors areas with a insulating material such as an oxide of silicon. The isolation, commonly known as field oxidation, is formed by a method known as LOCOS in which the transistor area is masked and the isolation area is thermally oxidized, or by a trench isolation method in which an opening is forming in the silicon and filled with insulation. Normally, the trench, which varies in width, is a shallow trench in depth and is known as shallow trench isolation or STI.

The field oxide is formed before the transistors with both of the LOCOS and STI methods. The STI provides the advantage of using less silicon than LOCOS thereby permitting a greater number of transistors for the same amount of silicon. However, STI is still susceptible to the formation of parasitic transistors under the field oxide or leakage along the edge of the field oxide.

One method to ensure that leakage does not occur along the edge of the STI isolation at the end of the transistor is to overlap the transistor's gate electrode onto the isolation areas. This overlap accommodates any gate-to-isolation misalignment and any gate pullback, both of which can occur during the forming of lithography pattern of the gate electrode. Although this overlap guarantees that the gate electrode does not leave a leakage path along the edge of the isolation, it unfortunately, limits how close two transistors can be positioned since the gate lithography process must be able to define the space between the gate ends of the two transistors.

SUMMARY OF THE INVENTION

The primary object of the present invention is to provide a method of fabricating integrated circuits which increases the packing density of integrated circuits while still reducing the parasitic transistor problem.

Another object of the present invention is to provide a method of fabricating integrated circuits which still permits the overlap the field oxide isolation edge to reduce the parasitic transistor problem but without being concerned about misalignment or gate pullback..

These objects are achieved in accordance with the present invention by a method which self-aligns the polysilicon gate over the active source/drain regions with the edge of the field isolation comprising the steps of: providing a semiconductor substrate with an upper surface; disposing an etch protective layer having a top surface and bottom surface on a semiconductor substrate; patterning the etch protective layer and forming openings therein corresponding to the pattern; using the openings in the etch protective layer as a mask to form openings in the semiconductor substrate; filling the openings in the etch protective layer and semiconductor substrate with insulating material to be essentially coplanar with the top surface of the etch protective layer to form field isolation trenches; masking selected ones of said field isolation trenches; planarizing the non-selected isolation trenches to the bottom level of the etch protective layer thereby leaving the selected ones of the field isolation trenches extending above the upper surface of the semiconductor substrate; and disposing polysilicon on the upper surface of the semiconductor substrate of a thickness so that, after planarization, the polysilicon is essentially coplanar with the selected ones of isolation trenches.

In accordance with another aspect of the present invention, an integrated circuit semiconductor structure comprising: a semiconductor substrate having an upper surface; at least one field effect transistor with a source, a drain and a gate formed in and on the semiconductor substrate, with the gate having a top, a width and a length; and at least one isolation trench formed in the semiconductor substrate and having a side and a top surface extending above the upper surface of the substrate, whereby the gate length of the transistor extends to and abuts said at one isolation trench and the top of the gate is essentially coplanar with the top surface of the trench, thereby eliminating any leakage path along the edge of the side of the isolation trench.

BRIEF DESCRIPTION OF THE DRAWINGS

The foregoing and other objects, aspects and advantages will be better understood from the following detailed description of a preferred embodiments of the invention with reference in the drawings, in which.

DETAILED DESCRIPTION OF THE PREFERRED EMBODIMENTS OF THE INVENTION

Figure 1:
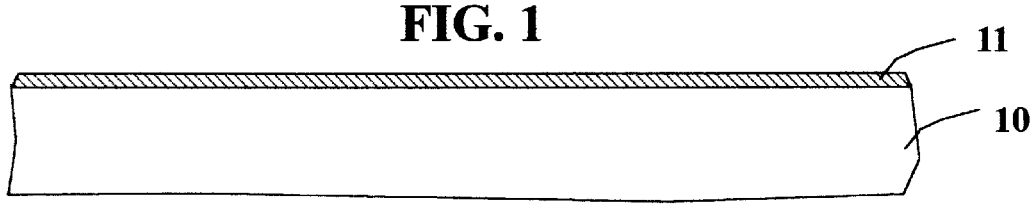
FIG. 1 is a cross-sectional view of a portion of a semiconductor substrate with a thin insulating layer.

A preferred embodiment of the integrated circuit of the present invention includes field effect transistors (FET) and comprises a semiconductor substrate, herein a silicon substrate 10 with a {100} plane orientation as shown in FIG. 1. The wafer 10 is doped with an appropriate impurity depending on whether the FETs are to be N-type or P-type. If the FETs are to be complementary N-type and P-type, such as complementary metal oxide silicon (CMOS) FETs, selected portions of the substrate 10 will be doped with appropriate impurities to form wells in the complementary areas. To simplify the description of the present invention, the preferred embodiment of the integrated circuit is an N-type FET and the substrate 10 is doped with a P-type impurity, herein boron (B), and includes a insulating layer 11, herein silicon oxide thermally grown on and in the silicon substrate 10.

Figure 2:
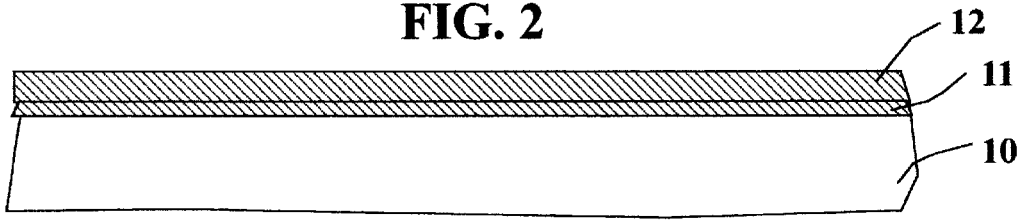
FIG. 2 is a cross-sectional view of the portion of the semiconductor substrate of FIG. 1 with a thicker insulating layer on the thin insulating layer.

Because isolation trenches are to be subsequently formed, an etch protective or barrier layer, whose etch and polish selectivity is different than the insulating material used for filling the trenches, is deposited on the silicon oxide layer 11 as shown in FIG. 2. In the present instant, the etch barrier material is a silicon nitride layer 12.

Figure 3:
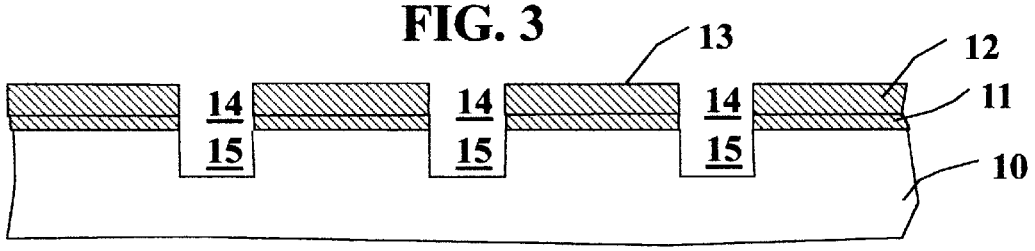
FIG. 3 is a cross-sectional view of the portion of the semiconductor substrate of FIG. 2 with openings formed in the insulating layers and the semiconductor substrate.
Figure 4:
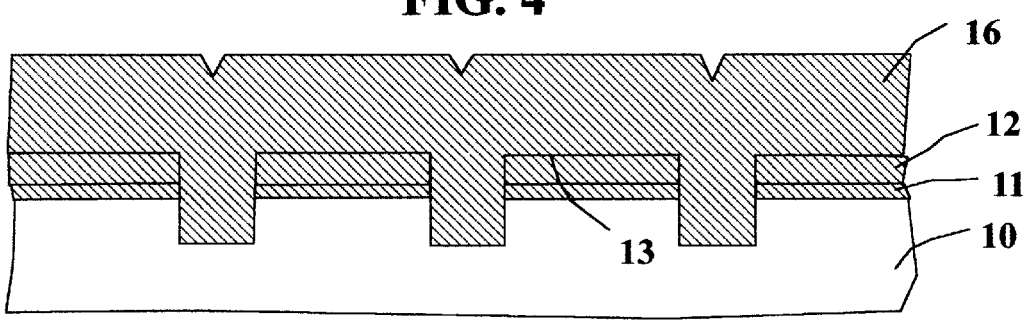
FIG. 4 is a cross-sectional view of the portion of the semiconductor substrate of FIG. 3 with an insulating material filling the openings.
Figure 5:
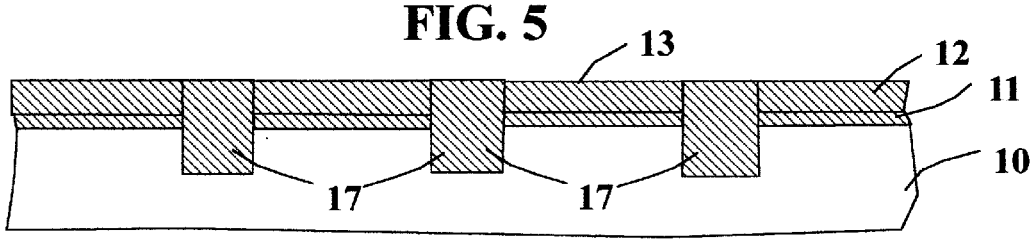
FIG. 5 is a cross-sectional view of the portion of the semiconductor substrate of FIG. 4 with the insulating material planarized level with the upper thicker insulating layer.

To fabricate the various components of the integrated circuit, the portion of the silicon substrate 10, as exemplary of other parts of the substrate, is coated, preferably by a conventional spin coating apparatus, with a commercially available deep UV resist (not shown) during various step in the fabrication. To form field oxide isolation, the surface 13 of the etch protective layer 12 is coated with resist (not shown) and an etch pattern is defined in the exposed and developed resist for groove openings 14 in first the nitride 12 and then the oxide layer 11 as shown in FIG. 3. The openings 14 in the etch protective layer 12 serves as a pattern for etching groove openings 15 in the silicon substrate 10. After the groove openings 15 are filled with insulating material 16, herein silicon oxide, as shown in FIG. 4, the material is essentially planarized level with the top surface 13 of the etch protective layer 12 to form field oxide trenches 17, herein shallow trench isolation (STI) as shown in FIG. 5.

Figure 6:
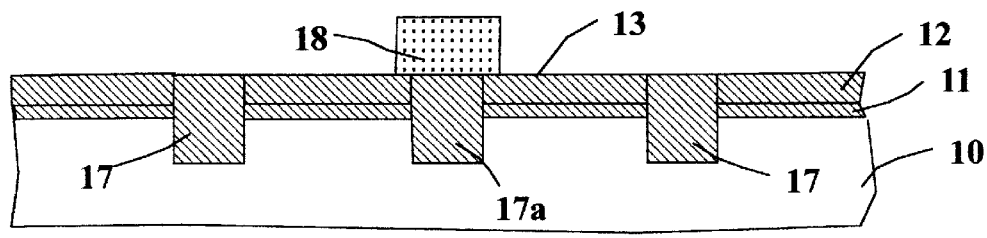
FIG. 6 is a cross-sectional view of the portion of the semiconductor substrate of FIG. 5 with a resist mask covering one of the filled openings.
Figure 7:
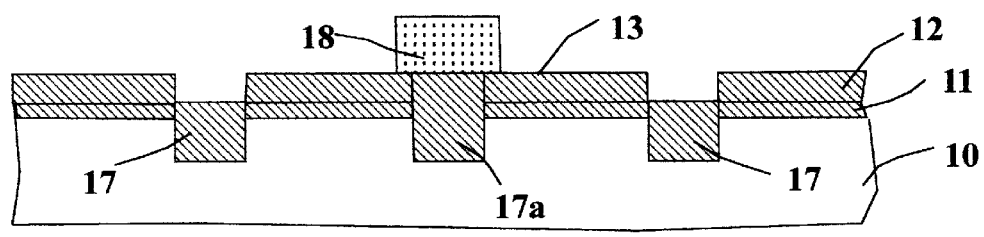
FIG. 7 is a cross-sectional view of the portion of the semiconductor substrate of FIG. 6 with a portion of the unmasked filled openings removed.
Figure 8:
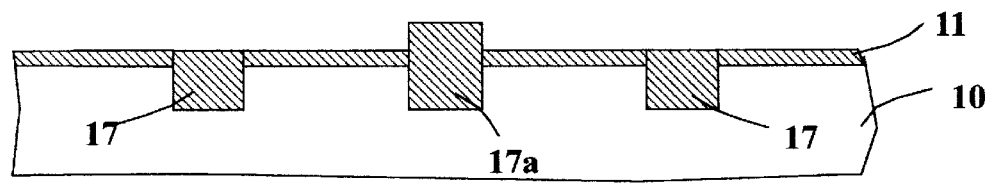
FIG. 8 is a cross-sectional view of the portion of the semiconductor substrate of FIG. 7 with the thicker insulating layer removed and the unmasked filled openings planarized level with the thin insulating layer, the previously masked filled opening extending above the thin insulating layer.
Figure 9:
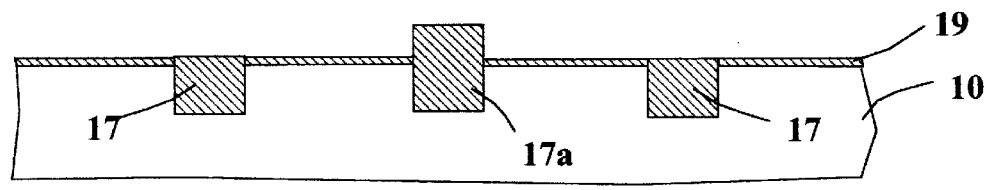
FIG. 9 is a cross-sectional view of the portion of the semiconductor substrate of FIG. 8 with thin insulating layer removed and replaced with a gate oxide layer.
Figure 10:
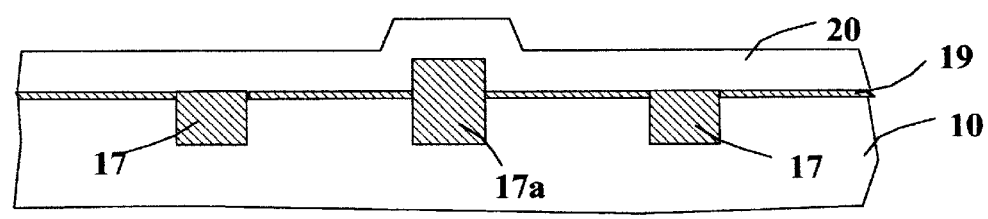
FIG. 10 is a cross-sectional view of the portion of the semiconductor substrate of FIG. 9 with a layer of polysilicon.
Figure 11:
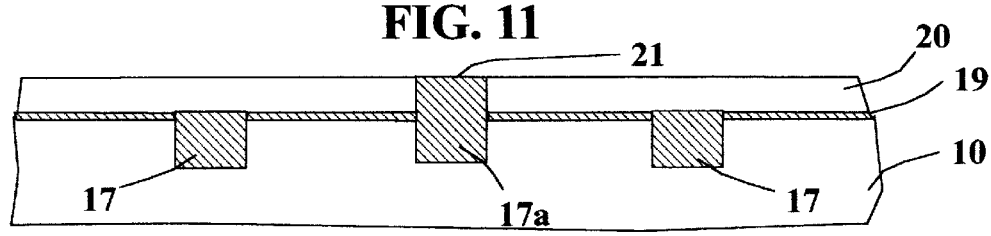
FIG. 11 is a cross-sectional view of the portion of the semiconductor substrate of FIG. 10 with the polysilicon layer planarized level with the top of previously masked filled opening.

Now in accordance with the present invention, a resist mask pattern 18 is created, as shown in FIG. 6, to selectively mask sections of the field oxide trench 17a, which have a gate tab (not shown) at least on one and, if desired on both sides of the field oxide trench 17a. The resist mask 16 protects the field oxide trench 17a in removing a portion of the trenches 17 to make their upper surface 18 essentially planar with the upper surface of the oxide insulating layer 11 as shown in FIG. 7. Preferably, the trenches 17 are anisotropically etched with a plasma reactor, although wet etching also can be used. The resist mask 16 further protects the field oxide trench 17a during the planarizing of the non-masked field oxide trenches 17 essentially level with the insulating layer 11 as shown in FIG. 8. After removal of the resist pattern 16, the silicon nitride layer 12 is stripped and impurities are implanted for creating wells and for pretailoring the threshold level of the transistors. The oxide insulating layer 11 then is removed and a thinner gate oxide 19 is grown by thermal oxidation as shown in FIG. 9. Now, a polysilicon gate material is deposited of a thickness, herein, to the height of the field oxide trench 17a above the surface of the gate oxide 19 on the silicon substrate 10 as shown in FIG. 10. The polysilicon layer 20 is planarized so as to be essentially level with the top surface 21 of the field oxide trench 17a as shown in FIG. 11.

Figure 12:
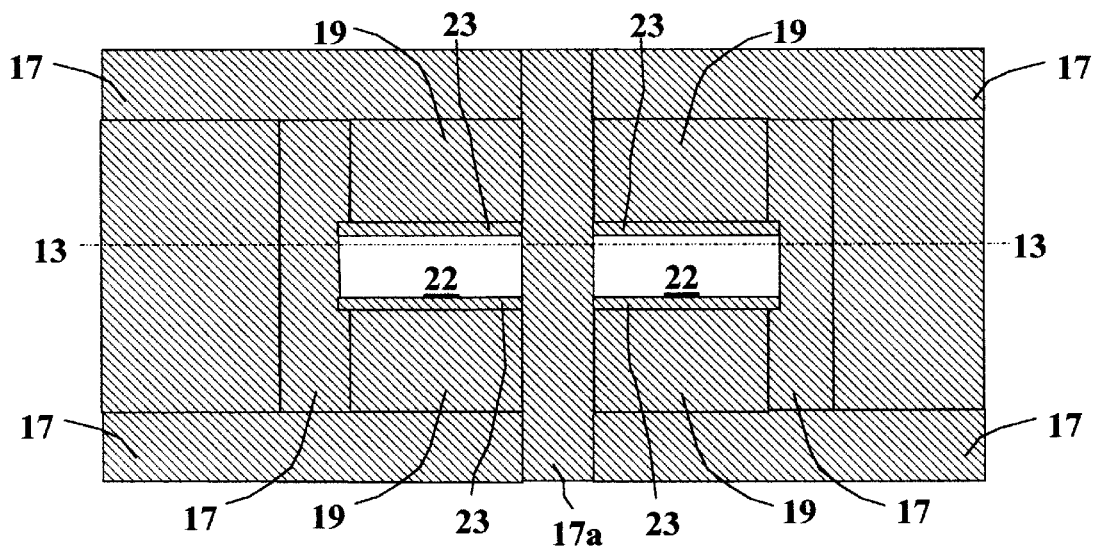
FIG. 12 is a plan view of the portion of the semiconductor substrate showing the polysilicon gates and their relationship to the isolation trenches.
Figure 13:
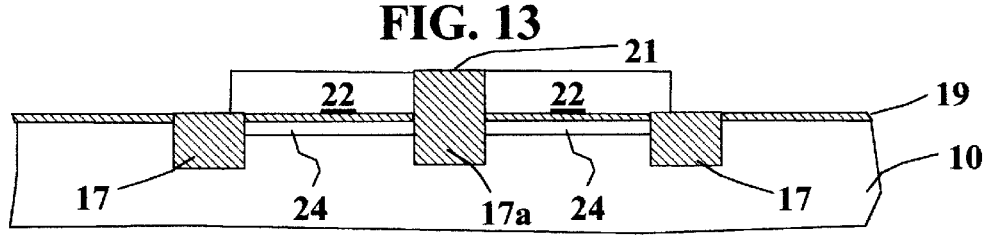
FIG. 13 is a cross-sectional view of the portion of the semiconductor substrate taken along line 13—13 of FIG. 12 and showing FETs formed between the field oxide trenches.
Figure 14:
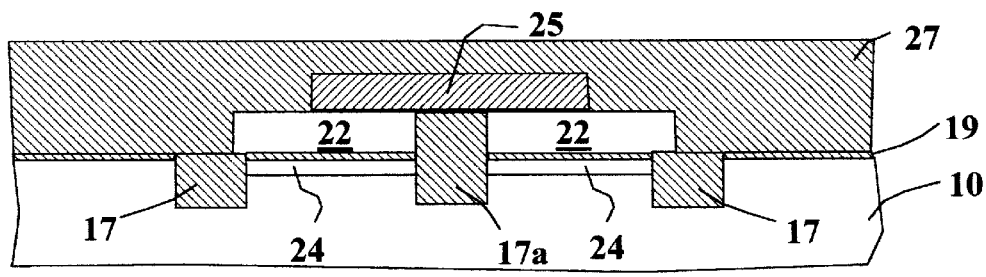
FIG. 14 is a cross-sectional view of the portion of the semiconductor substrate of FIG. 13 with a contact connecting the gates of the FETs.
Figure 15:
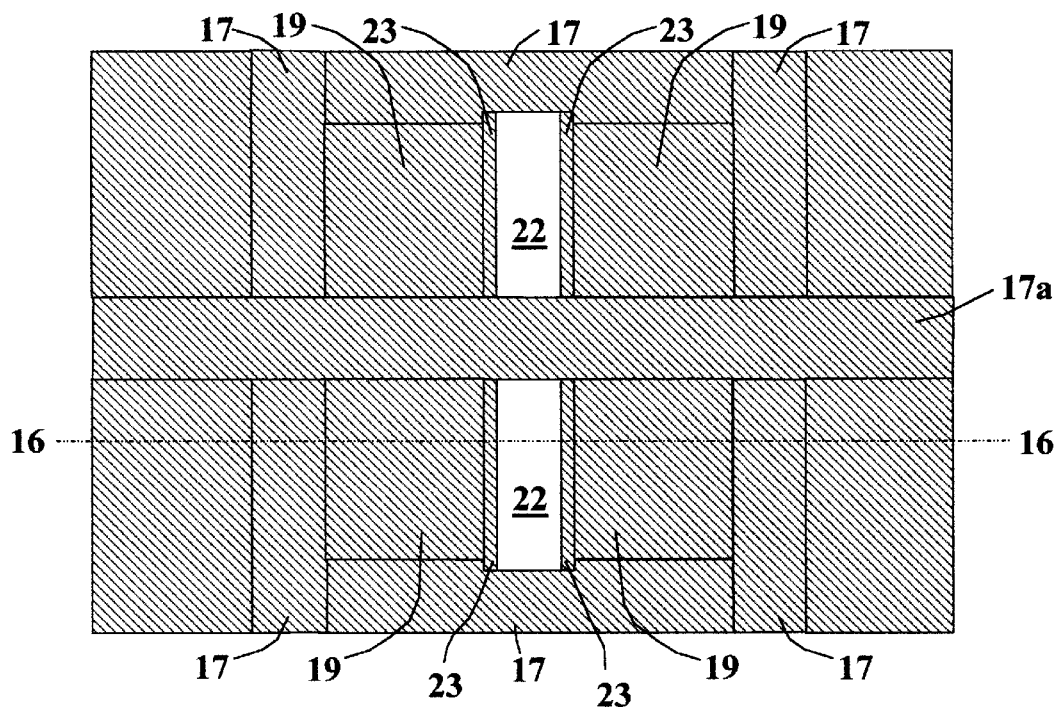
FIG. 15 is a plan view of the portion of the semiconductor substrate with the substrate of FIG. 15 rotated ninety degrees.
Figure 16:
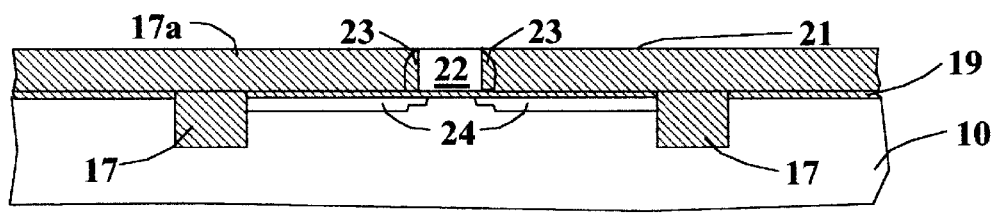
FIG. 16 is a cross-sectional view of the portion of the semiconductor substrate taken along line 16-16 and showing one of the FETs.
Figure 17:
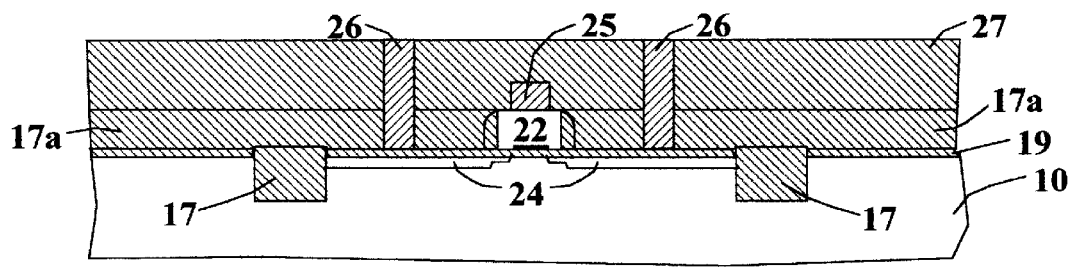
FIG. 17 is a cross-sectional view of FIG. 16 with contacts to the source, drain and gate of the FET.

The remaining steps in method of the present invention are conventional in fabricating an FET and include patterning the polysilicon layer to form polysilicon gates 22, which overlap the trenches 17 as shown in FIGS. 12, 13, 14 and 15. Herein, sidewalls 23 for forming lightly doped drains (LDDs) and sources and drains 24 as partially shown in the plan view of FIG. 12 and 14 and as shown in cross-section in FIGS. 16 and 17. FIG. 13 shows the FET structure and trenches 17 and 17a in cross-section. Contact 25 to the polysilicon gates 22 is part of this conventional fabrication as shown in FIG. 14, as well as interconnecting conductive lines (not shown) and are formed by standard semiconductor fabrication techniques. FIGS. 15, 16 and 17 are FIGS. 12, 13 and 14 rotated ninety degrees.

To supplement the above general description of the present invention, a detailed description of these steps will now be given. The silicon oxide 11 of FIG. 1 is thermally grown on the silicon substrate in an oxygen atmosphere at 900° C. to a thickness in the range of 100 to 150Å, followed by chemically vapor depositing the silicon nitride 12 from silane ($SiH_4$) and ammonia ($NH_3$) to a thickness in the range of 1200 to 2000Å as shown in FIG. 2. The resist (not shown), which is spin coated on the silicon nitride layer and is exposed and developed to create the pattern for the field oxide isolation, is a commercial positive deep UV resist. With the resist pattern in place, the silicon nitride and silicon oxide 12 and 11, respectively, are anisotropically etched using a parallel plate reactive ion etcher, with carbon trifluoride and oxygen ($CHF_3/O_2$) being used to etch the silicon nitride and carbon tetrafluoride ($CF_4$) being used to etch the silicon oxide. Following the etching of the nitride and oxide layers, the resist is removed by ashing in an oxygen atmosphere as is well known in the art. The etched openings 14 in the silicon nitride layer 12 now serves as an etch mask for etching the openings 15 in the silicon substrate as shown in FIG. 3 using the same parallel plate reactive ion etcher but with a plasma gas of ($HBr/Cl_2/CF_4$). Alternatively, sulfur hexafluoride ($SF_6$) may be used. The openings 14 and 15 are then filled as shown in FIG. 4 with silicon oxide by depositing from a conformal source of tetraethlyorthosilicate (TEOS). Alternatively, an electron cyclotron resonance (ECR) plasma reactor can be used for both etching the openings and filling the openings and provides the advantage of filling the openings without any voids in the silicon oxide by a deposition and etching process during filling. In addition, the walls of the silicon substrate openings 15 can be thermally oxidized to grow a thin layer (not shown) on the walls prior to filling with deposited silicon oxide. After filling the openings 14 and 15, the silicon oxide is planarized to be level with top surface 13 of the silicon nitride layer 12 using chemical/mechanical polish (CMP) with a commercially available slurry.

Now, in accordance with the present invention, the same type of positive deep UV commercial resist previously used in forming the field oxide openings is spin coated on the top surface 13 of the silicon nitride layer and patterned by exposure and development of the resist 18 to cover those field oxide trench 17a which will have a gate tab as shown in FIG. 12. The resist protects the trench 17a during the removal a portion of the trenches 17 by etching the silicon oxide in the trenches by wet etching in a hydrogen fluoride (HF) bath or by dry etching in a parallel plate reactor with carbon tetrafluoride until essentially planar with the upper surface of the layer 11. The silicon nitride layer 12 then is stripped in hot phosphoric acid after the resist is removed by ashing in an oxygen environment. After removal of the silicon oxide layer 11 by etching in the above reactor using carbon tetrafluoride and hydrogen, the surface of the exposed silicon substrate is thermally oxidized in and oxygen atmosphere at a temperature in the range of 800 to 950° C. to form a gate oxide 19 of a thickness of about 20 to 70Å as shown in FIG. 9. Next polysilicon is chemically vapor deposited using silane ($SiH_4$) in a commercially available LPCVD reactor to form a 2000Å layer 20 of polysilicon as shown in FIG. 10. After planarization by CMP using a commercial slurry, the polysilicon layer 20 is essentially level with the top surface 21 of the field oxide trench 17a. Thus, the polysilicon layer 20 is self-aligned with the field oxide isolation trench 17a as shown in FIGS. 11, 13 and 14. FIGS. 15, 16 and 17 are FIGS. 12, 13, and 14 rotated ninety degrees.

The remaining steps in the fabrication method are the conventional step for forming FET transistors. The polysilicon layer 20 is coated with a commercially available deep UV resist and exposed and developed to form pattern for plasma etching polysilicon gates 22. A sulfur hexafluoride and oxygen ($SF_6/O_2$) gas mixture in a parallel plate reactive ion etcher is used to etch the polysilicon layer 20 to form the gates 22 overlapping the trenches 17 as shown in the plan view of FIG. 12 and the cross-sectional view of FIG. 13. Because of the short channel length of the FETs, an lightly doped drain (LDD) impurity of phosphorus for N-type FETs is implanted in the source and drain regions 24 of the FETs, followed by forming sidewalls 23 on the polysilicon gates and implanting arsenic to complete the formation of the source and drain as best shown in FIG. 16. Although the polysilicon 20 may doped with an impurity either during or after deposition to lower the resistivity of the polysilicon and make it conductive, herein the polysilicon gates 22 also are implanted with arsenic during source and drain implantation step. The FETs are interconnected by contacts 25 and 26 and surrounded by insulation, herein silicon oxide as shown in FIG. 17. Metal suicides (not shown), such as titanium silicide, may be at the interface of the contacts and source, drain and gates of the FETs. Also, titanium silicide is formed on top of the field oxide isolation trench 17a for forming part of an interconnection 25 to the gate electrodes. The contact vias 26 from the source and drain and contact via 25 of FIG. 14 (partially shown in FIG. 17) on top of the trench provide electrical connection with other circuits of the integrated circuits with this portion of the silicon substrate 10.

Although this invention has been described relative to specific materials and semiconductor fabricating apparatus for forming integrated circuits on a wafer, it is not limited to the specific materials or apparatus but only to the specific structural characteristics of the integrated circuits and the method of fabricating such integrated circuits required for the present invention. Other materials and apparatus can be substituted for those described herein which will be well understood by those skilled in the microelectronics and semiconductor arts after appreciating the present invention.

Having thus described the invention, what is claimed is:

1. A method of fabricating field isolation trenches for isolating field effect transistors (FETs) in semiconductor substrate having selected ones of the trenches extend above the top surface of the substrate comprising the steps of:

providing a semiconductor substrate with an upper surface;

disposing an etch protective layer having a top surface and a bottom surface on a semiconductor substrate;

patterning the etch protective layer and forming openings therein corresponding to the pattern;

using the openings in the etch protective layer as a mask to form openings in the semiconductor substrate;

filling the openings in the etch protective layer and semiconductor substrate with insulating material to be coplanar with the top surface of the etch protective layer to form field isolation trenches;

masking selected sections of said field isolation trenches;

planarizing the non-selected isolation trenches to the bottom level of the etch protective layer thereby leaving the selected sections of the field isolation trenches extending above the upper surface of the semiconductor substrate; and disposing polysilicon on the upper surface of the semiconductor substrate of a thickness so that, after planarization, the polysilicon is essentially coplanar with the selected sections of isolation trenches.

2. The method of claim 1 wherein the semiconductor substrate is silicon and, prior to disposing the polysilicon on the semiconductor substrate, a gate oxide layer is thermally grown on the upper surface of the silicon substrate.

3. The method of claim 1 wherein an insulating layer is formed on the semiconductor substrate and beneath the etch protective layer.

4. The method of claim 3 wherein the insulating layer is silicon oxide and etch protective layer is silicon nitride.

5. The method of claim 1 wherein the semiconductor substrate is silicon and the openings in the substrate being surrounded by walls of silicon which are thermally oxidized prior to filling with insulation.

6. The method of claim 3 wherein the etch protective layer is removed by anisotropic etching with a gas which is more selective for silicon nitride than silicon oxide.

7. The method of claim 1 wherein the polysilicon is patterned into polysilicon gates of FETs and contacts are subsequently formed on the gates and extend onto the upwardly extending field isolation trenches.

8. The method of claim 1 wherein the planarization of the polysilicon layer is by chemical/mechanical polishing.

9. The method of claim 5 wherein insulating material is silicon oxide.

10. The method of claim 1 wherein the selected ones of the field isolation trenches are masked with a lithographic resist.

* * * * *